(12) United States Patent
Kautzky et al.

(10) Patent No.: US 8,477,456 B2
(45) Date of Patent: Jul. 2, 2013

(54) COMMONLY-POLED PIEZOELECTRIC DEVICE

(71) Applicant: Seagate Technology LLC, Cupertino, CA (US)

(72) Inventors: Michael Christopher Kautzky, Eagan, MN (US); Charles Everett Hawkinson, Crystal, MN (US); Daniel Paul Burbank, Minneapolis, MN (US); John Stuart Wright, Edina, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/633,004

(22) Filed: Oct. 1, 2012

(65) Prior Publication Data

US 2013/0026883 A1 Jan. 31, 2013

Related U.S. Application Data

(63) Continuation of application No. 12/489,271, filed on Aug. 4, 2009, now Pat. No. 8,279,557.

(51) Int. Cl.
*G11B 5/60* (2006.01)

(52) U.S. Cl.
USPC ........................................................ 360/234.4

(58) Field of Classification Search
USPC ........................................................ 360/234.4
See application file for complete search history.

(56) References Cited

U.S. PATENT DOCUMENTS

| | | | |
|---|---|---|---|
| 4,169,276 A * | 9/1979 | Rodal | 360/77.16 |
| 5,519,802 A | 5/1996 | Field et al. | |
| 5,525,528 A | 6/1996 | Perino et al. | |
| 5,615,041 A | 3/1997 | Field et al. | |
| 5,872,311 A | 2/1999 | Schaenzer et al. | |
| 6,238,933 B1 | 5/2001 | Sun et al. | |
| 6,501,625 B1 * | 12/2002 | Boismier et al. | 360/294.7 |
| 6,639,411 B1 | 10/2003 | Thomsen | |
| 6,687,097 B1 | 2/2004 | Anderson et al. | |
| 6,756,287 B2 | 6/2004 | Khlif et al. | |
| 6,788,093 B2 | 9/2004 | Aitren et al. | |
| 6,847,505 B2 | 1/2005 | Luo | |
| 7,119,995 B2 | 10/2006 | Granstrom et al. | |

(Continued)

FOREIGN PATENT DOCUMENTS

KR 20080013220 A 2/2008

OTHER PUBLICATIONS

Search Report and Written Opinion of the European Patent Office in counterpart European Application No. 10166805.1, Sep. 22, 2010.

(Continued)

*Primary Examiner* — Mark Blouin
(74) *Attorney, Agent, or Firm* — HolzerIPLaw, PC

(57) ABSTRACT

A system for poling piezoelectric devices comprises a plurality of thin-film components, a plurality of piezoelectric devices, a poling pad for poling the piezoelectric devices, a plurality of traces, and a plurality of current-limiting elements. The thin-film components are separated by dice lanes to form an array, and the piezoelectric devices are formed on the thin-film components. The traces connect the piezoelectric devices across the dice lanes in parallel to the poling pad. Each current-limiting element is connected in series with one of the piezoelectric devices, in order to limit current to individual piezoelectric devices that experience current-related failure.

20 Claims, 7 Drawing Sheets

U.S. PATENT DOCUMENTS

| | | | |
|---|---|---|---|
| 7,161,765 B2 * | 1/2007 | Ichikawa et al. | 360/234.5 |
| 8,068,313 B2 * | 11/2011 | Nishiyama et al. | 360/245.8 |
| 2004/0061969 A1 | 4/2004 | Yang et al. | |
| 2004/0164650 A1 * | 8/2004 | Xu et al. | 310/328 |
| 2005/0134144 A1 * | 6/2005 | Buhler et al. | 310/317 |
| 2006/0245110 A1 | 11/2006 | Hanchi et al. | |
| 2008/0074790 A1 * | 3/2008 | Kobayashi | 360/234.5 |

OTHER PUBLICATIONS

Sangouard et al. "A Novel Piezoelectric Microtransformer for Autonomous Sensors Application," DTIP of MEMS & MOEMS, Apr. 9-11, 2008, 4 pages.

* cited by examiner

COMMONLY-POLED PIEZOELECTRIC DEVICE

CROSS REFERENCE TO RELATED APPLICATION

The present application is a continuation application of U.S. patent application Ser. No. 12/489,271, filed Aug. 4, 2009, and titled "Commonly-poled Piezoelectric Device", which is hereby incorporated by reference in it's entirety.

BACKGROUND

Piezoelectric devices for thin-film electronics have a broad range of frequency responses, from DC force sensors and scales to piezoacoustic or acousto-electric sensors (AES), ultrasonic transducers and PWAS (piezoelectric wafer-active sensor) devices, which are used for high-frequency defect scanning, materials testing, impedance measurements and structural monitoring. In the area of piezoelectric crystal oscillators, response frequencies extend even higher, to the megahertz (MHz) range and above.

Piezoelectric materials are electrically neutral but have an anisotropic charge distribution, which results in a net polarization when the material is deformed. The polarization field generates a piezoelectric voltage (or a current signal), which varies as a function of the applied mechanical stress or strain. Alternatively, an external field can be applied in order to deform the piezoelectric, producing mechanical effects such as flexing an armature, manipulating a microelectromechanical system (MEMS) or microactuator device, or producing an acoustic, ultrasonic, or radio-frequency (RF) vibration.

Piezoelectric effects were first identified in natural single-crystal structures such as quartz, gallium phosphate and tourmaline. Modern industrial applications, however, typically utilize synthetic polycrystalline or sintered piezoceramic materials such as aluminum nitride (AlN), barium nitride (BN) and barium titanate ($BaTiO_3$). These materials can be manufactured in almost any shape and size, and the composition and manufacturing techniques can be varied in order to scale the piezoelectric effect to meet particular engineering requirements.

In synthetic polycrystalline materials, the piezoelectric effect depends upon the orientation of individual dipole regions within the material, which are referred to as Weiss domains. In general the Weiss domains are randomly oriented when the piezoelectric is formed, but they can be aligned by poling the material in an electric field, typically at elevated temperature. Poling encourages the growth of domains oriented along the poling field direction, and tends to reverse the orientation of anti-parallel domains.

Poling also reorients space charges and aligns the remnant polarization in ferroelectric materials such as $Pb[Zr_xTi_{1-x}]O_3$ (or PZT) based materials, which are inherently piezoelectric due to symmetry considerations. Essentially, poling reduces randomization in the domain orientations, generating a bulk domain asymmetry to yield a net piezoelectric effect. The piezoelectric/ferroelectric film thickness can also be varied, in order to enhance response for particular electronics applications.

Poled piezoelectric materials can actually have greater piezoelectric response than single-crystal (naturally-occurring) materials, and offer much more flexibility in manufacturing. Unfortunately, poling can also be expensive and time consuming, particularly when large numbers of individual devices are involved. As a result, there is a constant need for cost-effective and efficient poling techniques, as applicable to volume manufacturing for a wide range of different piezoelectric devices, including piezoacoustic sensors, ultrasonic transducers, MEMS devices, and other piezoelectric-based thin-film electronics and semiconductor components.

SUMMARY

This invention concerns a system for common poling of piezoelectric devices. The system comprises a plurality of thin-film electronic components, a plurality of piezoelectric devices, a plurality of traces, a plurality of current-limiting elements, and a poling pad.

The piezoelectric devices are formed on the thin-film components, which are divided by dice lanes to form a bar-type array, or by dice lanes and slice lanes to form a wafer-type array. The traces connect the piezoelectric devices in parallel to the poling pad, across the dice lanes. Each current-limiting element is connected in series with one of the plurality of piezoelectric devices, in order to form an open circuit or provide a current-limiting resistance when individual piezoelectric devices experience a current-related failure.

DETAILED DESCRIPTION

Figure 1:
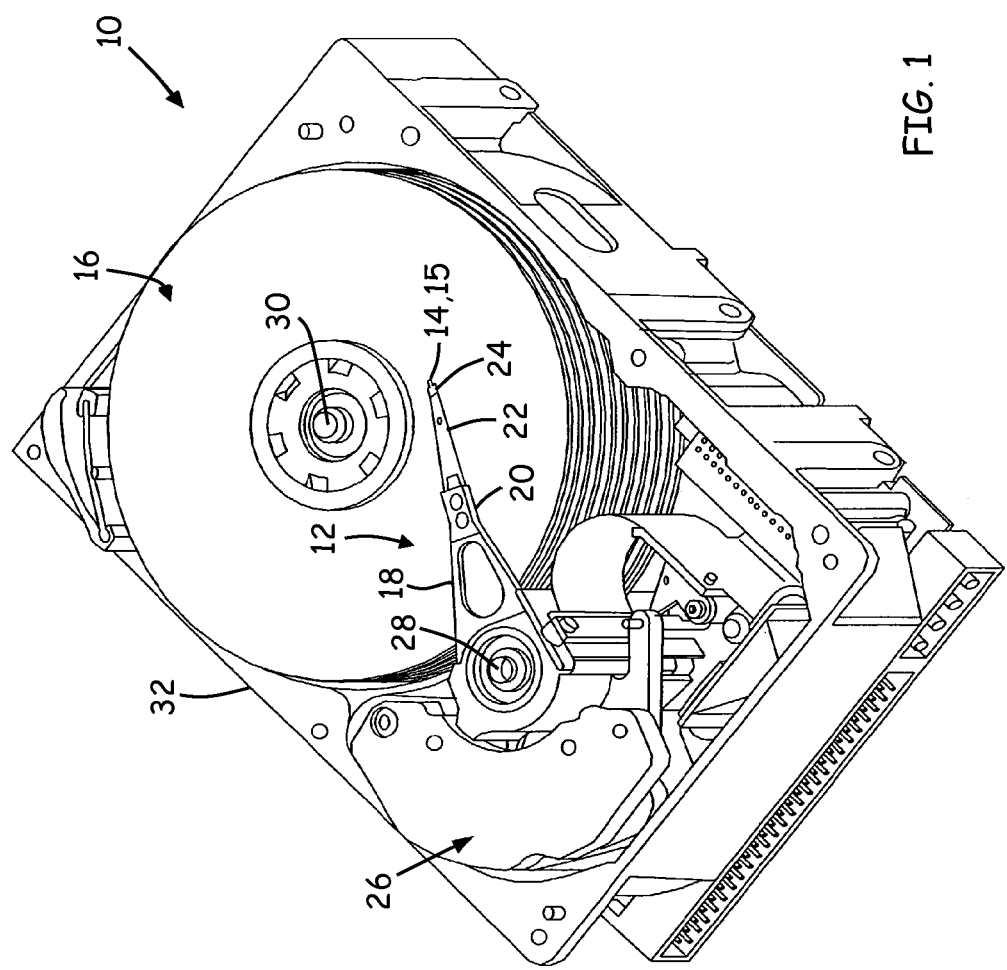
FIG. 1 is a perspective view of a magnetic recording system with an actuator for positioning a slider carrying a poled piezoelectric device.

FIG. 1 is a perspective view of magnetic recording system 10. System 10 comprises a disc drive with actuator assembly 12 for positioning slider 14 with poled piezoelectric device 15 over magnetic medium 16.

Magnetic data storage system 10 of FIG. 1 provides a particular example of a thin-film electronics application utilizing poled piezoelectric device 15. In this example, actuator assembly 12 comprises actuator arm 18 and a suspension with baseplate/mounting block 20, load beam 22 and flexure 24. Load beam 22 is connected to actuator arm 18 at baseplate/mounting block 20, and supports slider 14 on flexure 24. Voice coil motor 26 rotates actuator arm 18 about spindle axis 28, positioning slider 14 and poled piezoelectric device 15 with respect to magnetic medium 16.

Slider-based applications for poled piezoelectric device 15 include media glide heads and test heads for defect screening and testing of magnetic medium 16, and working or data heads for actual read/write operations. In working and data head embodiments, slider 14 includes a magnetic transducer or read/write element, and piezoelectric device 15 typically comprises a transducer-level AES device or capacitor-type piezoelectric sensor for fly height and pitch calibration, or for detecting contact between slider 14 and magnetic medium 16. Alternatively, poled piezoelectric device 15 is comprised within a thin-film microactuator, a MEMS-type micromechanical or microelectromechanical component, an AES or PWAS-type acoustic/ultrasonic sensor or transducer, or another, more generalized thin-film piezoelectric device.

As shown in FIG. 1, magnetic medium 16 takes the form of a magnetic disc, or a stack of parallel and coaxial discs. In operation of system 10, the disc or disc stack rotates about disc spindle 30 within housing 32, translating magnetic medium 16 with respect to slider 14. Actuator assembly 12 positions slider 14 and piezoelectric device 15 (or a plurality of sliders 14 and devices 15) with respect to magnetic medium 16, in order to perform media-related functions as described above.

In data head embodiments, slider 14 also carries a magnetic transducer as described above. The transducer typically includes both reader and writer elements, with the writer formed about a main pole having a main pole tip oriented toward magnetic medium 16. Magnetic flux is generated by switching the current in a coil formed about the main pole, creating flux loops that exit slider at the main pole tip and cross through the external surface facing magnetic medium 16.

Data are recorded by switching the write current as actuator 12 positions slider 14 over magnetic medium 16, generating bit patterns along a series of generally parallel or concentric data tracks. The bit patterns are recorded by orienting the magnetic domains in medium 16 according to the strength and polarity of the write current and flux loops.

Typically, system 10 employs perpendicular writing techniques, in which flux loops enter magnetic medium 16 in a substantially perpendicular sense and bits are laid down with a perpendicular orientation along each track. Alternatively, the flux and bit orientations are longitudinal.

Data are read back from medium 16 via a reader element such as a magnetoresistive (MR) device, in which the electrical resistance depends upon local magnetic field strength and direction. This reader reads back the bit pattern as a function of a sense current, which varies with magnetic domain orientation while slider 14 tracks across magnetic medium 16.

Figure 2:
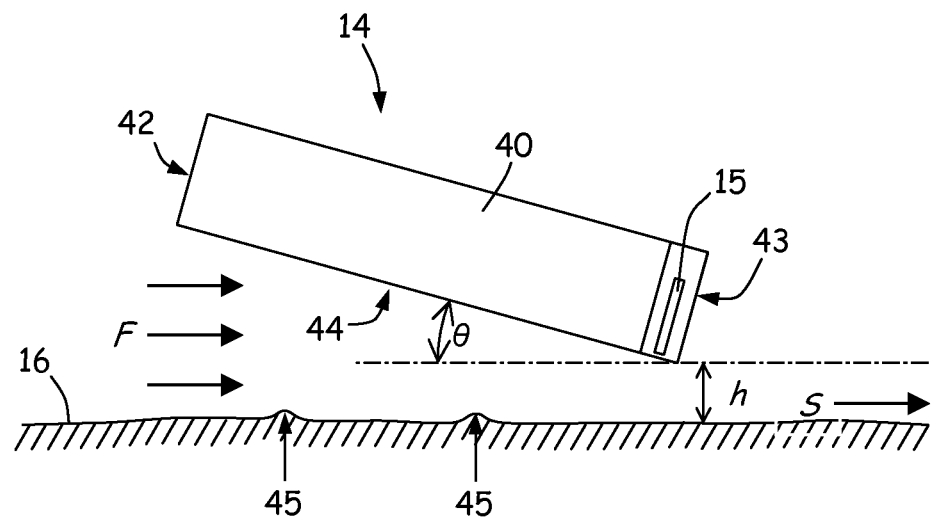
FIG. 2 is a schematic diagram of the slider and piezoelectric device of FIG. 1, positioned above a magnetic medium.

FIG. 2 is a schematic diagram of slider 14 and poled piezoelectric device 15, positioned above magnetic medium 16. Slider 14 comprises slider body 40 with leading edge 42, trailing edge 43 and external media-facing surface 44. In this particular embodiment, poled piezoelectric device 15 is located proximate trailing edge 43 of slider 14, as defined by tracking direction S of magnetic medium 16.

Depending on embodiment, piezoelectric device 15 is provided with a range of coatings and protective materials selected to address incompatibility issues raised by the various chemical and mechanical processing steps used to manufacture the other components of slider 14. In disc-based magnetic storage systems, for example, media-facing surface 44 is typically referred to as an air-bearing surface (ABS), and poled piezoelectric device 15 is typically recessed or spaced from surface 44 by an insulating material or coating as shown in FIG. 2. In working head embodiments, piezoelectric device 15 is formed at any point before, during or after the head build process, and is thus located either above or below the read/write structure with respect to slider body 40, or within the transducer body itself.

As magnetic medium 16 tracks past slider 14 in tracking direction S, it generates windage flow F at leading edge 42 and along external surface 44. Slider body 40 is further aerodynamically shaped, enabling slider 14 to "fly" on windage F above magnetic medium 16. The orientation and position of slider 14 are defined by pitch angle (PA) $\theta$ and fly height (FH) h, as measured with respect to the surface of magnetic medium 16.

Note, however, that FIG. 2 is not to scale, and that fly height h and pitch angle $\theta$ are arbitrary with respect to the relative dimensions of slider body 40. In particular, pitch angle $\theta$ is typically exaggerated with respect to its nominal value of a few degrees, as characteristic of normal read-write operations. While slider 14 is shown with a positive pitch, moreover, pitch angle $\theta$ can also be negative or zero, for example during load/unload events, head crashes and slider/media contact events.

The location and functions of piezoelectric device 15 depend upon the configuration of slider 14, or the other electronic elements with which device 15 is employed. In test head and data head applications, for example, piezoelectric device 15 sometimes comprises an acoustic sensor, an ultrasonic transducer or another capacitor-type piezoelectric device, which responds to stress or vibrational signals generated when slider body 40 contacts magnetic medium 16, for instance at one or more of asperities 45. In this embodiment, fly height h is adjusted as slider 14 and sensor 15 are scanned over medium 16, in order to map out the asperity profile and lock out non-conforming tracks or sectors, or to reject unsatisfactory media.

Alternatively, piezoelectric device 15 comprises a piezoelectric layer that responds to a control voltage or control current based on fly height h, for example a pitch angle bias mechanism that responds to a tunnel current measured between magnetic medium 16 and a tunnel electrode on slider body 40. This allows piezoelectric device 15 to adjust pitch angle $\theta$ and control fly height h by altering the aerodynamic properties of slider 14, either by deforming slider body 40 itself or via a mechanical coupling to the flexure.

In further embodiments, slider 14 represents a more generalized electronic component or thin-film device. In these embodiments, piezoelectric device 15 comprises any of an acoustic, ultrasonic or PWAS-type sensor or transducer, or a microactuator, bias mechanism or MEMS-type device, and performs piezoelectric functions that may or may not be related to magnetic medium 16.

Figure 3:
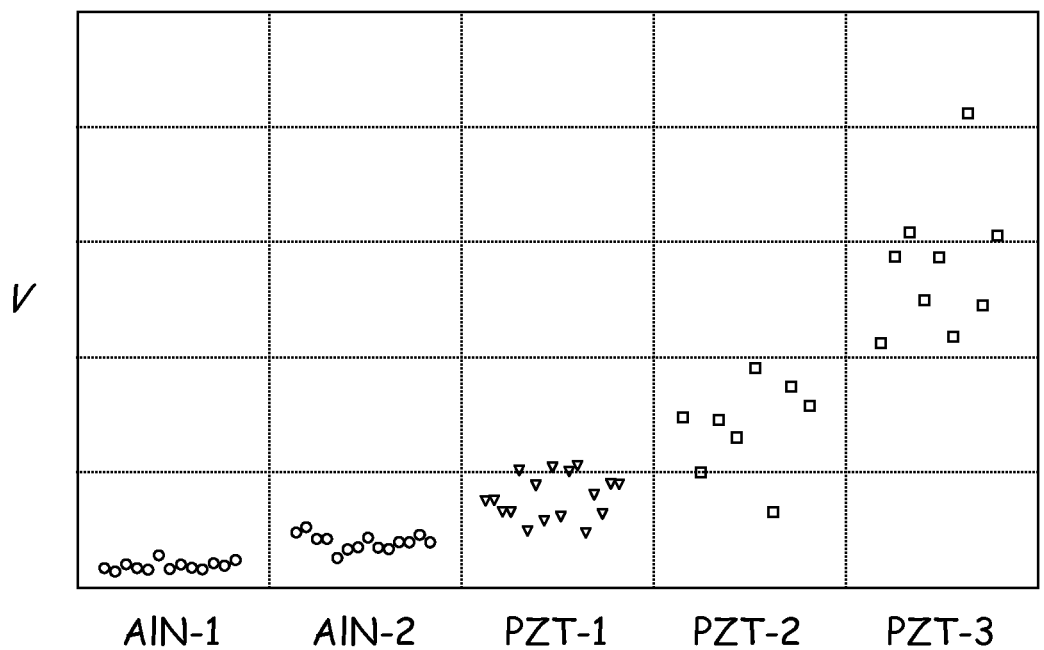
FIG. 3 is a scatter plot showing piezoelectric response for poled and unpoled ferroelectric devices, as compared to dielectric devices.

FIG. 3 is a scatter plot showing piezoelectric response signal voltage V for poled ferroelectric PZT devices (PZT-1, PZT-2 and PZT-3), as compared to dielectric devices (AlN-1 and AlN-2). FIG. 3 plots piezoelectric signal voltage V on the vertical, in response to a standardized deformation-inducing mechanical input. Each data point corresponds to a one hundred sweep average.

As illustrated by FIG. 3, piezoelectric devices formed of dielectric materials such as aluminum nitride (AlN) tend to have lower response than devices formed of ferroelectric materials such as PZT. For AlN materials in particular, this is true whether the $d_{33}$ parameter is relatively low or relatively high (AlN-1 and AlN-2, respectively; circles), where the $d_{33}$ parameter is an element of the piezoelectric tensor (or piezoelectric matrix), as defined herein via dielectric displacement vector $D_i$. That is, $$D_i = d_{ij}\sigma_j + \in_{ij} E_j,\quad [1]$$

with piezoelectric tensor $d_{ij}$, stress vector $\sigma_j$ and permittivity tensor (or permittivity matrix) $\in_{ij}$. Applied field $E_j$ is typically taken to be zero for sensor applications, with $d_{33}$ (and the other relevant components of piezoelectric matrix $d_{ij}$) scaled by a constant term to account for units (for example, by the ratio of picocoulomb/newton or pC/N).

The relative response of ferroelectric PZT devices is illustrated by samples PZT-1, PZT-2 and PZT-3. The PZT-1 sample (triangles) was not poled, but exhibits a self-poling piezoelectric effect as described below. The PZT-2 and PZT-3 samples (squares) were both poled, the former (PZT-2) at ambient temperature and the latter (PZT-3) at an elevated temperature.

The PZT-1 sample demonstrates that an external poling voltage is not always necessary, because of self-poling effects. Self poling typically occurs after deposition of texture films with an easy axis aligned perpendicularly to the film plane, or due to polarization switching over the operational lifetime of a particular component, for example in FeRAM (Ferroelectric memory) devices. As FIG. 3 shows, however, self-poling does not typically result in optimized response.

The piezoelectric effect can be substantially increased by poling, for example in an external field of approximately 100-300 kV/cm (that is, about 10-30 V across a 1 μm film). Depending on embodiment, the poling voltage is either a DC voltage or a pulsed voltage signal, and the poling period extends from about one minute to about ten minutes. Poling also takes place either at ambient temperature (PZT-2), or at an elevated poling temperature of about 100-150° C. (PZT-3).

Even in the self-poled case (PZT-1), ferroelectric PZT-type piezoelectric devices exhibit greater response than the baseline dielectric AlN-type devices. Depending upon baseline comparison (either AlN-1 or AlN-2), poling conditions and pyrochlore or other non-piezoelectric phase content, the average response of the poled PZT-2 and PZT-3 samples exceeds that of the dielectric devices by a factor of about five or more (that is, $\geqq 5\times$). For the PZT-3 (elevated temperature) sample, the average response is up to about six and one half times ($\approx 6.5\times$) greater than that of either baseline AlN device. When the piezoelectric film thickness is optimized, the theoretical response is ten or more times ($\geqq 10\times$) that of the baseline AlN devices, and potentially twenty to twenty-five times higher ($\geqq 20-25\times$).

For sensor and transducer-type devices, a primary benefit of increased piezoelectric response is greater signal size for a given stress input. For actuators and electromechanical or MEMS-type devices, increased response provides greater control capability. In addition, poling allows the response to be adjusted or calibrated by varying the poling conditions, which is not possible in unpoled or self-poled devices.

Unfortunately poling can be impractical for slider and other component-level applications, due to a combination of the relatively long poling time required for optimized response, the low throughput and the high capital equipment investment required for volume production. These effects are particularly relevant for wafer and bar-level manufacturing processes, which involve large arrays of hundreds or thousands of individual piezoelectric devices. Standard parallel ganging techniques are also problematic, because shorting, breakdown and leakage failures in a single device can compromise the entire poling process.

The wafer and bar-based (array-level) poling techniques described here address these concerns by reducing processing time and poling steps, and utilizing circuit designs that are robust with respect to individual component failure. At the same time, these techniques are adaptable to the fabrication of complex microelectronic elements, including slider-based testing and data heads for defect screening, calibration and data storage operations on magnetic media.

Figure 4:
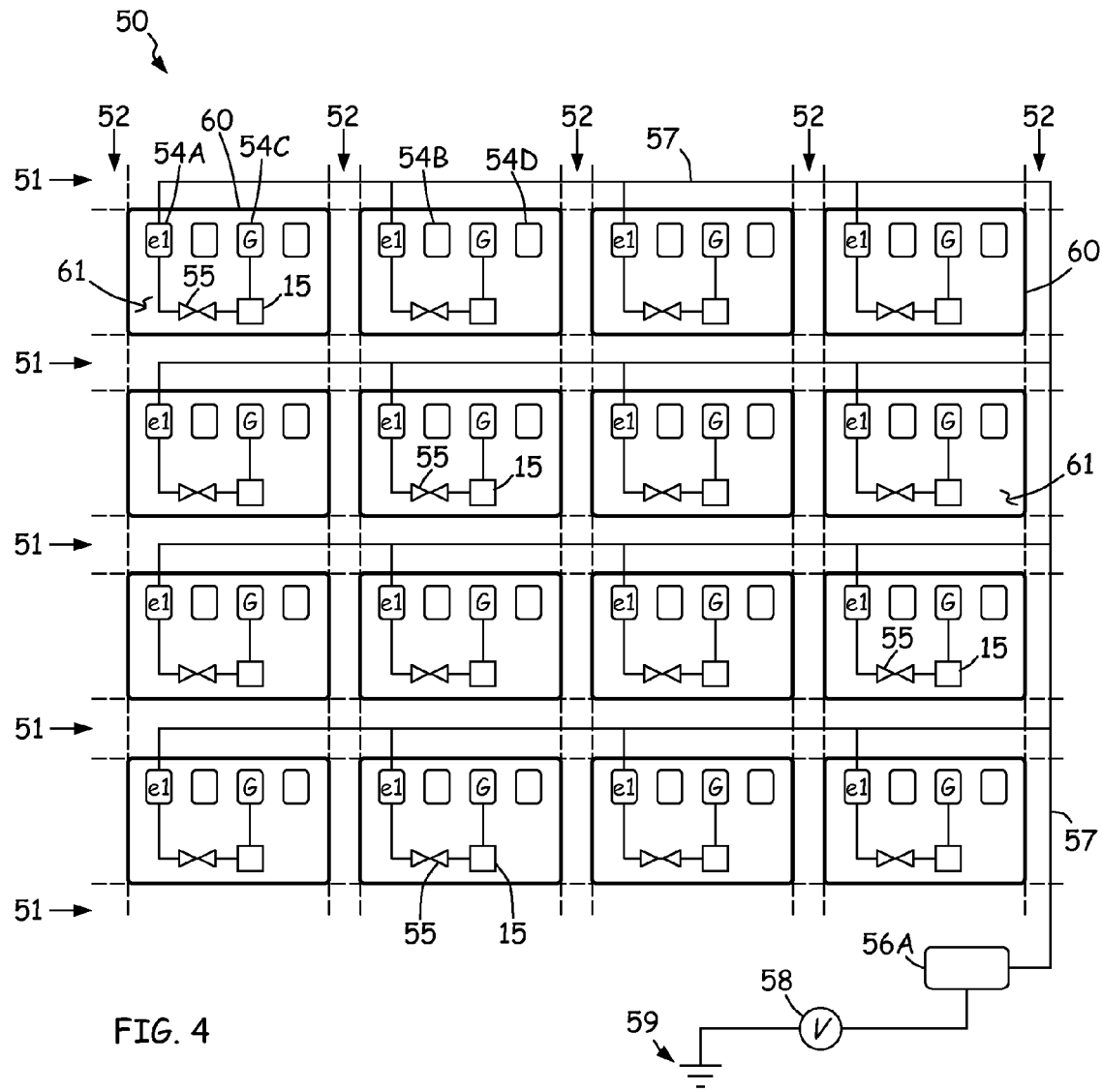
FIG. 4 is a wafer-level wiring diagram for common poling of piezoelectric devices, in a single-ended capacitor-type wiring embodiment.

FIG. 4 is a wafer-level wiring diagram for common poling of piezoelectric devices 15. A plurality of piezoelectric devices 15 are mounted on surfaces 61 of microelectronic components 60, for example on trailing edge 43 of sliders 14 as shown in FIG. 3, above. Components 60 and piezoelectric devices 15 are organized into array (or matrix) 50, as arranged on a silicon wafer or an analogous structure for multi-component electronics manufacture.

Typically, array 50 is arranged in rectangular columns and rows to fill a circular wafer, or a rectangular wafer or bar. Rows of components 60 are separated along slice lanes 51, which run generally horizontally in FIG. 4, and individual components 60 are separated along dice lanes 52, which run generally vertically (that is, perpendicular to slice lanes 51).

A number of pads 54A, 54B, 54C and 54D are formed on each surface 61, in order to make connections between component 60 (e.g., a slider) and the disc drive or other electronics system utilizing piezoelectric device 15. The number and designation of individual pads 54A-54D vary, however, depending upon the configuration of piezoelectric device 15 and the other elements on component 60.

In the single-ended capacitor-type wiring embodiment of FIG. 4, for example, first and second electrodes on each piezoelectric device 15 are connected to first electrode pad 54A (e1) and common ground pad 54C (G), respectively. The first and second electrodes are typically formed on top and bottom opposing surfaces of piezoelectric device 15, with particular configuration depending on manufacturing preference and technique.

Current-limiting elements 55 are connected in series with each piezoelectric device 15 in array 50. The series connection is made individually, such that there is a one-to-one series connection between each current-limiting element 55 and each piezoelectric device 15, different piezoelectric devices 15 and current-limiting elements 55 connected in parallel. In the embodiment of FIG. 4, for example, individual series connections are formed by connecting one current-limiting element 55 between first electrode pad 54A and the first electrode on each piezoelectric device 15. In other embodiments, current-limiting elements 55 are located between the second electrode and common ground pad 54C, or between the second electrode and a second electrode pad (see, e.g., FIGS. 6A and 6C, below).

Typically, a number of additional pads (e.g., 54B and 54D) are utilized for making connections to additional components such as a read/write transducer or tunnel electrode. Alternatively, pads 54B and 54D are utilized in alternate wiring configurations for piezoelectric device 15 (e.g., FIGS. 5, 6C and 7B), and additional pads are provided for the other components.

Piezoelectric devices 15 are commonly poled prior to separating individual components 60 from array 50. This is accomplished, for example, by connecting poling pad 56A to first electrodes 54A via traces 57, and providing a poling voltage via voltage source 58. Poling pad 56A is typically located an edge region of the wafer or other multi-component fabrication structure on which array 50 is arranged, or another area reserved for electrical or mechanical connections during the manufacturing process.

In the single-ended wiring embodiment of FIG. 4, voltage source 58 imposes a poling voltage on poling pad 56A with respect to ground 59. In other embodiments, voltage source 58 imposes a differential poling voltage between first poling pad 56A and a second differential poling pad 56D (e.g., FIGS. 5, 6C and 7B). Typical poling voltages, times and temperatures are described above with respect to FIG. 3.

Traces 57 are typically formed of a conductive metal such as copper, silver or gold. Masking, etching and milling techniques are used to create a trace network from the conductor, connecting poling pad 56A in parallel to each individual piezoelectric device 15 and current-limiting element 55. As shown in FIG. 4, for example, traces 57 connect poling pad 56A in parallel to each piezoelectric device 15 via first electrode pad 54A, with current-limiting element 55 connected in series between first electrode pad 54A and piezoelectric device 15 and piezoelectric device 15 connected in series between current-limiting element 55 and ground pad 54C.

Current-limiting elements 55 are wired in series with each piezoelectric device 15 in order to limit current during poling. In particular, current-limiting elements 55 limit current through piezoelectric devices 15 in the event of a shorting failure, a leakage failure, a breakdown or other event resulting in excess current during the poling process. Unacceptable levels of current are defined by requiring an effective poling voltage to be supplied to each piezoelectric device 15; that is, current-limiting elements 55 operate to limit the leakage or shorting current so that a current-related failure on one piezoelectric device 15 does not compromise the poling process for other devices 15.

In the particular embodiment of FIG. 4, current-limiting element 55 is configured to create an open circuit when the poling current exceeds a particular threshold, for example when piezoelectric device 15 experiences a shorting failure. In one such embodiment, current-limiting element 55 comprises a thin-film fuse having two contacts formed of a highly conductive and oxidation-resistant material connected by a conducting strap. Typically, the strap material has higher resistivity than the contact material, and is capable of sustaining poling currents on the order of nanoamperes (nA) or microamperes (μA), but incapable of sustaining breakdown, shorting or leakage currents on the order of one milliamp (1 mA) or more.

When the current limit is exceeded, the fuse "blows;" that is, the fuse materials melt, vaporize, electromigrate or react, breaking the electrical connection between first-electrode pad 54A and piezoelectric device 15. This creates an open circuit that effectively removes failed piezoelectric devices 15 from the poling circuit, while the rest of the poling circuit remains intact. As a result, a single shorting, breakdown or leakage failure does not compromise the poling process for other (still operable) piezoelectric devices 15 in array 50. This substantially reduces waste as compared to traditional parallel ganged arrangements, while dramatically reducing processing time as compared to component-level (serial) poling methods.

In fuse-type embodiments, current-limiting element 55 comprises a combination of materials including, but not limited to, gold, chromium, aluminum, polysilicon, metal silicides. Alternatively, current-limiting element 55 comprises a thin-film circuit breaker or analogous device. In each of these embodiments, the maximum acceptable poling current depending upon the material composition and dimensions of current-limiting element 55, and upon design choices such as whether the open circuit should be created only in the case of a shorting or breakdown failure, or in the case of a substantial leakage current failure as well.

Traces 57 are formed along slice lanes 51 and dice lanes 52, which define array 50 of components 60, each utilizing at least one piezoelectric device 15. In particular, slice lanes 51 divide two-dimensional wafer-type array 50 into one dimensional bar-type arrays (e.g., FIGS. 6A-6C and 7A-7C), and dice lanes 52 divide the bar-type arrays into individual components 60 with individual piezoelectric devices 15 on surfaces 61.

In the one-sided wiring configuration of FIG. 4, traces 57 form a single-sided comb network that extends vertically along one at least one dice lane 52, and horizontally along slice lanes 51. In this embodiment, traces 57 are sometimes formed in a single layer or processing step, in order to reduce manufacturing time and cost. Alternatively, traces 57 are formed in a number of layers, depending upon the particular wiring configuration of each piezoelectric device 15 and current-limiting element 55.

Traces 57 are typically removed after poling piezoelectric devices 15, before dividing array 50 into individual components 60. In one embodiment, for example, traces 57 are formed on exposed surfaces 61 (i.e., the top layer) of components 60 (e.g. FIGS. 6A-6C and 7A-7C), and are removed by wet etching or a similar chemical process. Alternatively, traces 57 are formed in slice lanes 51 and dice lanes 52, as shown in FIG. 4, and removed via slicing, dicing, singulation and lap operations, for example by diamond saw cutting, abrasion, or as part of a polishing process. In these embodiments, trace metal sometimes remains on surfaces 61 of components 60.

Figure 5:
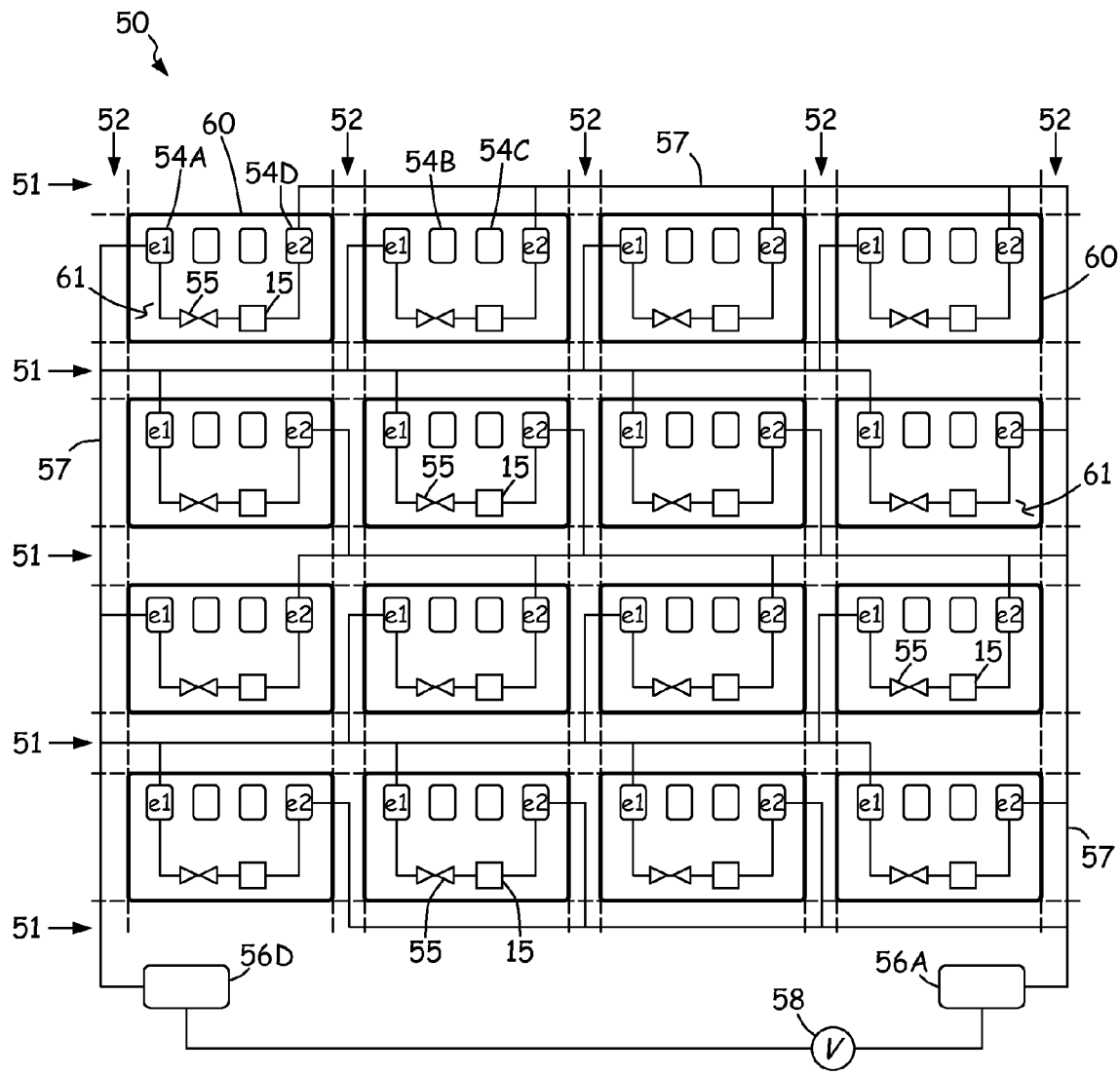
FIG. 5 is a wafer-level wiring diagram for common poling of piezoelectric devices, in a differential capacitor-type wiring embodiment.

FIG. 5 is an alternate wafer-level wiring diagram for common poling of piezoelectric devices 15. Piezoelectric devices 15 are mounted in array fashion on individual components 60, as described above, forming array 50 as divided along slice lanes 51 and dice lanes 52.

As in the single-ended wiring configuration of FIG. 4, traces 57 connect poling pad 56A in parallel to a first electrode on piezoelectric device 15, via first electrode pad 54A (e1). In the differential poling configuration of FIG. 5, however, traces 57 also connect differential poling pad 56D to a second electrode on piezoelectric device 15, via second electrode pad 54D (e2), and voltage source 58 imposes a differential poling voltage between first poling pad 56A and second poling pad 56D.

As shown in FIG. 5, differential network traces 57 form a dual-comb structure that extends along both slice lanes 51 and dice lanes 52. This configuration allows traces 57 to be formed as a single layer or film, with a single masking step, as described above for the single-comb structure of FIG. 4. Alternatively, traces 57 are formed as a number of overlapping layers, depending upon the particular configuration of piezoelectric devices 15 and current-limiting elements 55. Multiple-layer trace networks require additional masking, etching and milling steps, but also provide greater flexibility in trace placement and connections.

As in the single-ended wiring embodiment of FIG. 4, above, current-limiting elements 55 limit current to individual devices that experience current-related failure during poling, while leaving the poling connections intact for other, operable piezoelectric devices 15. In particular, individual current-limiting elements 55 limit current to each individual piezoelectric device 15, preventing loss of effective poling voltage in the event of a short, break or current leakage.

Figure 6A:
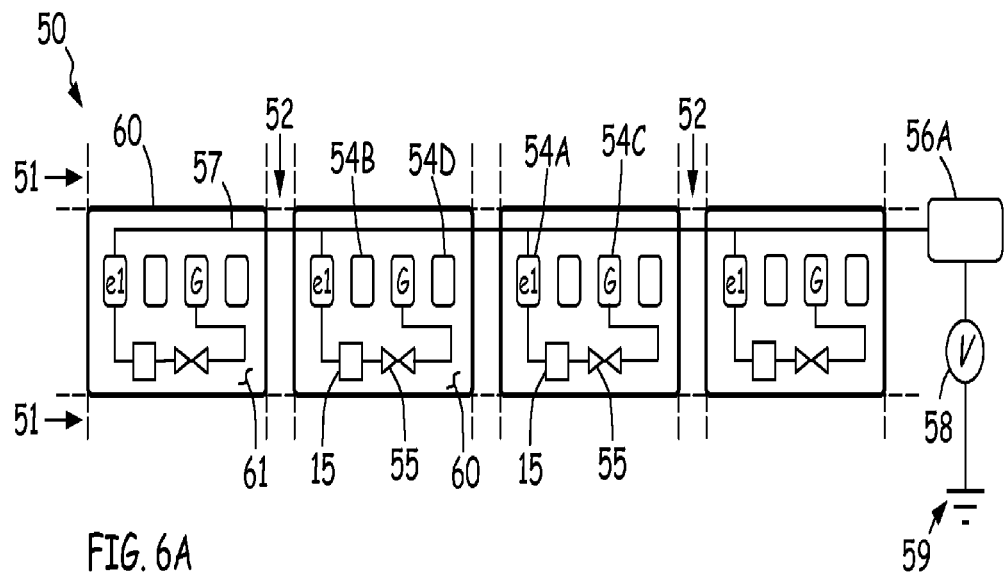
FIG. 6A is a bar-level wiring diagram for common poling of piezoelectric devices, utilizing a fuse-type current-limiting element.
Figure 6B:
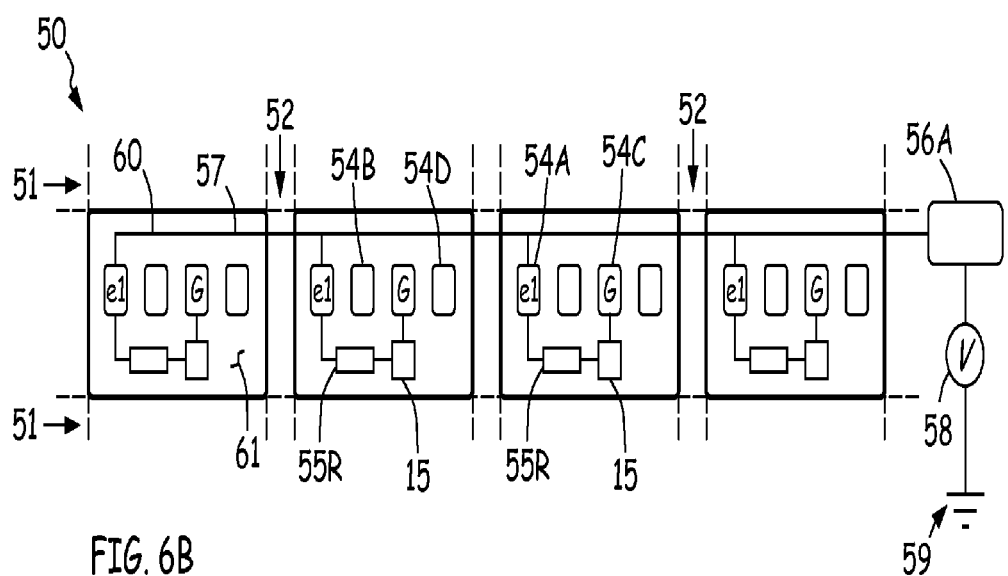
FIG. 6B is a bar-level wiring diagram for common poling of single-ended piezoelectric devices, using a resistor-type current-limiting element.
Figure 6C:
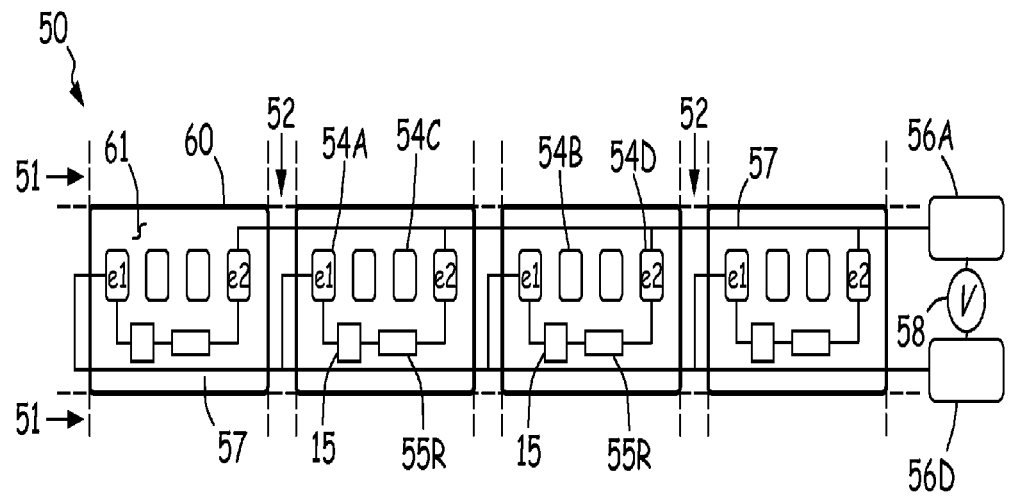
FIG. 6C is a bar-level wiring diagram for common poling of differential piezoelectric devices, using a resistor-type current-limiting element.

FIGS. 6A-6C are bar-level wiring diagrams for common poling of piezoelectric devices 15. In these embodiments, piezoelectric devices 15 are provided in a single-row or one-dimensional array 50, for example after slicing the two-dimensional array of FIG. 4 or FIG. 5, above.

In the particular embodiment of FIG. 6A, current-limiting element 55 comprises a fuse, circuit breaker or other open-circuit-type current-limiting element, which is connected in series with piezoelectric device 15 between a second electrode and common ground pad 54C. In the embodiments of FIGS. 6B and 6C, current-limiting element 55R comprises a thin-film resistor or other resistive element. Resistive current-limiting elements 55R are also connected in series with piezoelectric device 15, for example between first electrode pad 54A and a first electrode of piezoelectric device 15 (as shown in FIG. 6B), between a second electrode and second electrode pad 54D (FIG. 6C). Alternatively, current-limiting elements 55R utilize common ground pad 54C, as shown for fuse-type element 55 of FIG. 6A.

In contrast to open-circuit embodiments, however, resistor-based current-limiting elements 55R reduce the current to piezoelectric device by providing a resistive element in series with each piezoelectric device 15. This generates resistive heating and associated losses, but has the advantage that the resistor defines a maximum current through each piezoelectric device 15, even if the device suffers a shorting failure, but without forming an open circuit on the slider.

Resistor-type current-limiting elements 55R also have utility when leakage currents are an issue, but are insufficient to trip or blow fuse-type or circuit-breaker-type devices. In one such embodiment, resistive elements 55R comprise high-value resistors of approximately 1 MΩ or more, such that the maximum poling current to each piezoelectric device 15 is limited to about 30 µA for a poling voltage of about 30 V or less. Given an upstream trace network resistance of, for example, about 500Ω (based on a 100 mm long Cu trace that is 4 µm wide and 1 µm thick), this reduces the voltage drop to about one-half volt (0.5 V) per faulty resistor. This voltage drop is acceptable for relatively low failure rates, in that it maintains an effective poling voltage for operable piezoelectric devices 15 when the failure rate falls within a normal manufacturing range. Higher failure rates sometimes result in lower poling voltages, and potentially indicate a more serious bar-level or wafer-level issue.

In bar-level embodiments, poling is performed after components 60 are divided into one-dimensional arrays 50, for example by etching or cutting along slice lanes 51. In these embodiments, trace networks 57 are typically excluded from slice lanes 51, for example by forming traces 57 on exposed surfaces 61 of components 60, thus crossing only dice lanes 52. In wafer-level embodiments, poling is performed before components 60 are divided into bars along slice lanes 51, and bar-level trace networks 57 are formed in either slice lanes 51 or dice lanes 52, as well as on top surfaces 61 of components 60 (see, e.g., FIGS. 4 and 5).

Figure 7A:
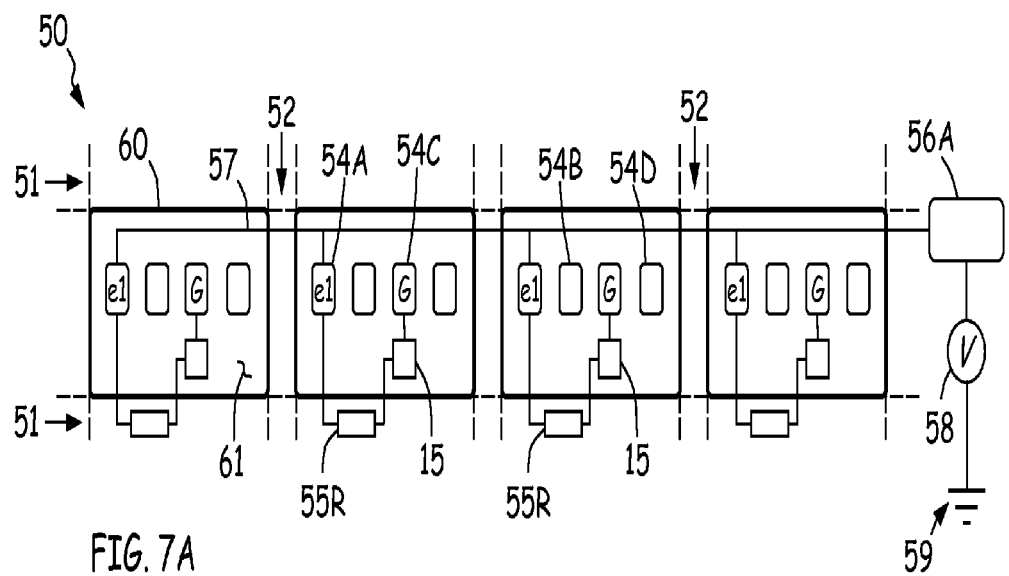
FIG. 7A is a bar-level wiring diagram for common poling of piezoelectric devices, showing an alternate position for the current-limiting element.

FIG. 7A is a bar-level wiring diagram for common poling of piezoelectric devices 15, showing an alternate position for resistor-type current-limiting elements 55R. In the embodiment of FIG. 7A, resistive elements 55R are located in slice lane 51, rather than on slider 60. Alternatively, resistive elements 55R are located in dice lanes 52.

Off-component placement of resistive current-limiting elements 55R introduces extra material (particularly, additional metal) into slice lanes 51 or dice lanes 52. This is not typically desirable from a manufacturing standpoint, but off-slider placement is useful when surfaces 61 of components 60 are subject to space constraints, for example along the trailing edge of a slider. This is particularly true for resistor-type current-limiting elements 55R, which sometimes require substantial real estate, but off-slider placement is also useful in some configurations that utilize open circuit-type (fuse or circuit breaker) current limiting elements 55.

Figure 7B:
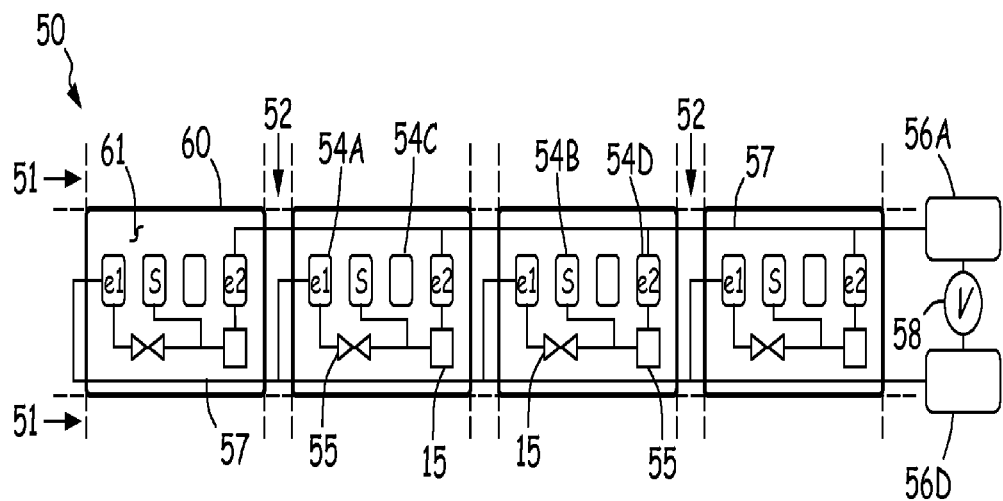
FIG. 7B is a bar-level wiring diagram for common poling of single-ended piezoelectric devices, utilizing on-slider sacrificial pads to remove individual devices with high leakage current.
Figure 7C:
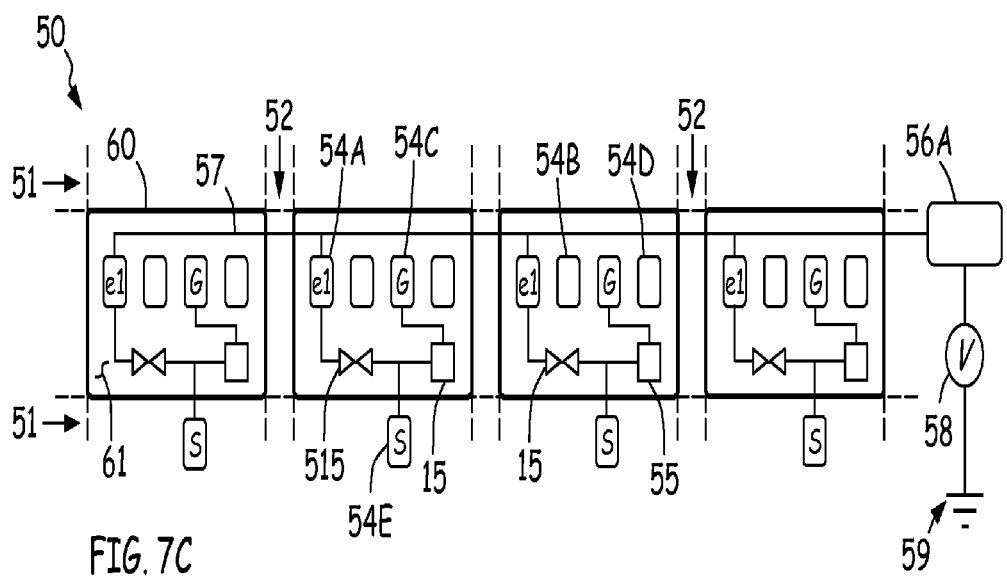
FIG. 7C is a bar-level wiring diagram for common poling of differential piezoelectric devices, utilizing off-slider sacrificial pads to remove individual devices with high leakage current.

FIGS. 7B and 7C are an alternate bar-level wiring diagram for common poling of single-ended piezoelectric devices 15. In this embodiment, sacrificial pads 54B or 54E are used to remove individual piezoelectric devices 15 from the poling circuit.

Sacrificial pads 54B or 54E (S) are connected in series with fused or circuit breaker-type embodiments of current-limiting element 55, in order to remove current-limiting elements 55 with high leakage current from the poling circuit. In the embodiment of FIG. 7B, for example, sacrificial pads 54B are located on surfaces 61 of components 60, and connected in series between current-limiting elements 55 and piezoelectric device 15. In the embodiment of FIG. 7C, sacrificial pads 54E have off-component placement, for example in slice lanes 51 (as shown) or in dice lanes 52.

Because high leakage currents can reduce the downstream poling potential, current leakage is sometimes an issue even when the currents do not reach the level required to trip or blow open-circuit-type current-limiting elements 55. To address this problem, the isolation leakage current value of each piezoelectric device 15 is measured by a wafer probe test or similar means. When individual piezoelectric devices 15 fail the leakage test (that is, the leakage current exceeds a given specification), a forcing current is applied through current-limiting element 55 via sacrificial pad 54B or 54E. The forcing current trips or blows current-limiting element 55, removing the high-leakage path from the poling circuit. This approach is applicable to both single-ended and differential wiring configurations (compare FIGS. 7B and 7C).

In contrast to the wafer-level poling techniques described in FIGS. 4 and 5, the bar-level techniques of FIGS. 6A-6C and 7A-7C provide individual poling pads 56A and 56D for each bar (each one-dimensional array 50 of components 60), rather than each wafer (each two-dimensional array 50). In these bar-level embodiments, traces 57 are typically formed across dice lanes 52, and not in slice lanes 51, and on surfaces 61 of components 60. This preserves each bar-level poling circuit when components 60 are divided into bar arrays 50 along slice lanes 51. Alternatively, the various slider-level component and wiring configurations shown in FIGS. 6A-6C and 7A-7C are also applied on a wafer level. This is accomplished by eliminating the bar-level poling pads and extending the structure of traces 57 to a two-dimensional array of components 60, using wafer-level poling pads. In these embodiments, trace networks 57 are typically formed in both slice lanes 51 and dice lanes 52, as shown in FIGS. 4 and 5.

While this invention has been described with reference to particular embodiments, the terminology used is for the purposes of description, not limitation. Workers skilled in the art will recognize that changes may be made in form and detail without departing from the spirit and scope of the invention, including the substitution of various equivalents for particular invention elements and adaptations of the invention's teachings to different materials, situations and circumstances. Thus the invention is not limited to the particular embodiments disclosed herein, but encompasses all embodiments falling within the scope of the appended claims.

The invention claimed is:

1. A system comprising:
 a plurality of thin-film components to form an array;
 a plurality of piezoelectric devices formed on the plurality of thin-film components;
 a poling pad for poling the plurality of piezoelectric devices;

a plurality of traces connecting the plurality of piezoelectric devices at least partially in parallel to the poling pad; and a plurality of current-limiting elements, each current-limiting element being connected with one of the plurality of piezoelectric devices.

2. The system of claim 1, wherein each current-limiting element comprises a fuse that creates an open circuit when one of the individual piezoelectric devices experiences current-related failure.

3. The system of claim 2, further comprising a sacrificial pad connected in series with the fuse, such that the fuse creates the open circuit when a forcing potential is applied to the sacrificial pad.

4. The system of claim 1, wherein each current-limiting element comprises a resistor that provides a current-limiting resistance when one of the individual piezoelectric devices experiences current-related failure.

5. The system of claim 1, wherein each piezoelectric device is connected between a single-ended electrode pad and a common ground pad on each thin-film component.

6. The system of claim 5, wherein the plurality of traces connect each piezoelectric device to the poling pad in a single-comb parallel trace configuration.

7. The system of claim 1, wherein each piezoelectric device is connected between first and second differential electrode pads on each thin-film component.

8. The system of claim 7, wherein the plurality of traces connect each piezoelectric device to the poling pad in an interleaved dual-comb parallel trace configuration.

9. The system of claim 1, wherein each thin-film component in the array comprises a slider for use with a data storage system operating on a magnetic medium.

10. The system of claim 9, wherein each piezoelectric device comprises a piezoelectric sensor for detecting contact between the slider and the magnetic medium.

11. A method comprising:
forming the array of ferroelectric devices on a wafer;
connecting the ferroelectric devices to a poling pad via a trace network;
limiting current to individual ferroelectric devices that experience current-related failure by connecting a current-limiting element with each ferroelectric device; and
applying a poling voltage to the poling pad.

12. The method of claim 11, wherein limiting current to individual ferroelectric devices comprises opening a circuit to each individual ferroelectric device that experiences current-related failure.

13. The method of claim 12, wherein opening the circuit comprises applying a forcing potential to a sacrificial pad connected in series with each ferroelectric device that experiences current-related failure.

14. The method of claim 11, wherein limiting current to individual ferroelectric devices comprises connecting a current-limiting resistor in series with each ferroelectric device in the array.

15. The method of claim 11, wherein connecting the ferroelectric devices to the poling pad comprises forming a single-mask, single-comb parallel trace network that connects a first electrode on each ferroelectric device to the poling pad.

16. The method of claim 11, wherein connecting the ferroelectric devices to the poling pad comprises forming a single-mask, dual-comb interleaved parallel trace network that connects a first electrode on each ferroelectric device to the poling pad and connects a second electrode on each ferroelectric device to a second poling pad.

17. The method of claim 11, wherein applying the poling voltage comprises applying a poling voltage of at least 10 V to the poling pad, and further comprising heating the slider to at least 100° C. for at least one minute.

18. A slider comprising:
a slider body;
a sensor that generates piezoelectric signals in response to stress in the slider body;
a poling pad connected to the sensor for applying a poling voltage; and
a current-limiting element connected between the sensor and the poling pad.

19. The slider of claim 18, wherein the current-limiting element comprises a fuse configured to create an open circuit when the sensor experiences a shorting or breakdown failure.

20. The slider of claim 18, further comprising a sacrificial pad connected in series with the fuse and the sensor, such that the fuse creates the open circuit when a forcing voltage is applied to the sacrificial pad.

* * * * *